(12) United States Patent
Mori

(10) Patent No.: US 10,295,615 B2
(45) Date of Patent: May 21, 2019

(54) MAGNETIC SENSOR

(71) Applicant: Murata Manufacturing Co., Ltd., Nagaokakyo-shi, Kyoto-fu (JP)

(72) Inventor: Daisuke Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 345 days.

(21) Appl. No.: 15/407,307

(22) Filed: Jan. 17, 2017

(65) Prior Publication Data
US 2017/0123018 A1 May 4, 2017

Related U.S. Application Data

(63) Continuation of application No. PCT/JP2015/068470, filed on Jun. 26, 2015.

(30) Foreign Application Priority Data

Jul. 23, 2014 (JP) .................... 2014-149867

(51) Int. Cl.
*G01R 33/09* (2006.01)
*H01L 43/08* (2006.01)

(52) U.S. Cl.
CPC ............. *G01R 33/09* (2013.01); *H01L 43/08* (2013.01)

(58) Field of Classification Search
CPC .... G01R 33/09; G01R 15/205; G01R 33/025; G01R 33/072; G01R 33/0082;
(Continued)

(56) References Cited

U.S. PATENT DOCUMENTS 5,049,809 A * 9/1991 Wakatsuki ........... G01R 15/205
257/E43.004
6,191,579 B1 * 2/2001 Striker ..................... G01D 3/08
324/207.21
(Continued)

FOREIGN PATENT DOCUMENTS

JP 09-102638 A 4/1997
JP 11-274598 A 10/1999
(Continued)

OTHER PUBLICATIONS

Official Communication issued in Japanese Patent Application No. 2016-535853, dated Jul. 25, 2017.
(Continued)

*Primary Examiner* — Son T Le
(74) *Attorney, Agent, or Firm* — Keating & Bennet, LLP

(57) ABSTRACT

A magnetic sensor includes a rectangular or substantially rectangular substrate and at least one first magnetoresistive element on the substrate. The first magnetoresistive element has a pattern that, in plan view, has a rectangular or substantially rectangular outer shape and includes first slits that extend in a radiating manner from a center of the pattern and approach an outer edge of the pattern and second slits between adjacent first slits and extend from the outer edge of the pattern toward the center of the pattern. The pattern is connected to circle around the center of the pattern while alternately changing direction between a first direction toward the outer edge of the pattern and a second direction toward the center of the pattern.

20 Claims, 8 Drawing Sheets

(58) Field of Classification Search
CPC ...... G01R 33/063; G01D 5/145; G01D 5/147; G01D 5/16
See application file for complete search history.

(56) References Cited

U.S. PATENT DOCUMENTS

| | | | | |
|---|---|---|---|---|
| 6,326,780 | B1* | 12/2001 | Striker | G01D 5/145 324/207.2 |
| 2002/0006017 | A1* | 1/2002 | Adelerhof | G01D 5/145 360/315 |
| 2002/0149358 | A1* | 10/2002 | Doescher | G01B 7/30 324/207.21 |
| 2015/0115949 | A1 | 4/2015 | Itagaki | |

FOREIGN PATENT DOCUMENTS

| | | |
|---|---|---|
| JP | 2008-170359 A | 7/2008 |
| JP | 2012-088225 A | 5/2012 |
| JP | 2013-250182 A | 12/2013 |
| WO | 2013/171977 A1 | 11/2013 |

OTHER PUBLICATIONS

Official Communication issued in corresponding International Application PCT/JP2015/068470, dated Sep. 15, 2015.

\* cited by examiner

MAGNETIC SENSOR

CROSS REFERENCE TO RELATED APPLICATIONS

This application claims the benefit of priority to Japanese Patent Application No. 2014-149867 filed on Jul. 23, 2014 and is a Continuation Application of PCT Application No. PCT/JP2015/068470 filed on Jun. 26, 2015. The entire contents of each application are hereby incorporated herein by reference.

BACKGROUND OF THE INVENTION

1. Field of the Invention

The present invention relates to a magnetic sensor and, in particular, relates to a magnetic sensor that includes a magnetoresistive element.

2. Description of the Related Art

Japanese Unexamined Patent Application Publication No. 11-274598, Japanese Unexamined Patent Application Publication No. 9-102638, International Publication No. 2013/171977, Japanese Unexamined Patent Application Publication No. 2012-88225 and Japanese Unexamined Patent Application Publication No. 2013-250182 disclose magnetic sensors that improve the isotropy of magnetic field detection.

The pattern of a magnetoresistive element of the magnetic sensor disclosed in Japanese Unexamined Patent Application Publication No. 11-274598 has a spiral shape. The two ends of the spiral-shaped pattern are formed at the outermost parts of the pattern located on opposite sides to each other. The pattern of the magnetoresistive element is substantially formed of curved portions.

In the magnetic sensor disclosed in Japanese Unexamined Patent Application Publication No. 9-102638, a magnetoresistive element has a circular shape formed by being wound through a plurality of turns in a spiral shape, and is formed through film deposition so as to be isotropic with respect to an external magnetic field.

In the magnetic sensor disclosed in International Publication No. 2013/171977, each of a plurality of magnetoresistive elements of a bridge circuit is connected so as to be successively folded back, with plural portions that extend in a direction that is substantially orthogonal to the overall magnetic field direction being arrayed in parallel at specific intervals, and each of the plural portions is connected to be successively folded back, formed in a zigzag state that is electrically connected, with multiple portions that extend in the magnetic field detection direction being arrayed parallel at specific intervals.

The magnetic sensor disclosed in Japanese Unexamined Patent Application Publication No. 2012-88225 is formed by connecting two magnetoresistive elements, which each have a shape formed by continuously connecting semicircular arc-shaped patterns of different diameters, in parallel with each other.

In the magnetic sensor disclosed in Japanese Unexamined Patent Application Publication No. 2013-250182, the center of a first sensing part having a regular octagon shape and the center of a second sensing part having a regular octagon shape are aligned with each other and the first sensing part is arranged outside the second sensing part. The linear layout of a second magnetoresistive element of the second sensing part is inclined at 22.5° with respect to the linear layout of a first magnetoresistive element of the first sensing part.

The magnetic sensors disclosed in the first four publications discussed above include a substrate that has a rectangular shape in plan view. Consequently, when the outer shape of a magnetoresistive element is a shape other than a rectangular shape in plan view, there is likely to be excess space around the magnetoresistive element. Therefore, it would be possible to further reduce the size of the magnetic sensors.

Thus, it is desirable to further improve the isotropy of magnetic field detection in the magnetic sensors disclosed in the publications discussed above.

SUMMARY OF THE INVENTION

Preferred embodiments of the present invention provide a small-sized magnetic sensor having improved isotropy in magnetic field detection.

A magnetic sensor according to a preferred embodiment of the present invention includes a substrate having a rectangular or substantially rectangular shape in plan view and at least one first magnetoresistive element provided on the substrate. The first magnetoresistive element includes a pattern that has a rectangular or substantially rectangular outer shape in plan view. In plan view, the pattern is provided with a plurality of first slits that extend in a radiating manner from a center of the pattern and approach an outer edge of the pattern and a plurality of second slits that are located between adjacent first slits and extend from the outer edge of the pattern toward the center of the pattern, and the pattern is connected so as to circle around the center of the pattern while alternately changing direction between a first direction toward the outer edge of the pattern and a second direction toward the center of the pattern.

In a preferred embodiment of the present invention, the magnetic sensor includes a plurality of the first magnetoresistive elements. The plurality of first magnetoresistive elements are electrically connected to each other and define a bridge circuit.

In a preferred embodiment of the present invention, the magnetic sensor further includes at least one second magnetoresistive element that has a lower rate of change of resistance than the first magnetoresistive element. The first magnetoresistive element and the second magnetoresistive element are electrically connected to each other and define a bridge circuit.

In a preferred embodiment of the present invention, the second magnetoresistive element includes at least one unit pattern that includes a plurality of bent portions and has a folded back shape. The unit pattern does not include any linear extending portions having a length of about 10 μm or more.

In a preferred embodiment of the present invention, the second magnetoresistive element includes a plurality of the unit patterns. The plurality of the unit patterns are arranged along an imaginary circle and connected to each other.

In a preferred embodiment of the present invention, the second magnetoresistive element includes a plurality of the unit patterns. The plurality of unit patterns are arranged along an imaginary polygon and connected to each other.

According to various preferred embodiments of the present invention, isotropy of magnetic field detection is greatly improved while making a magnetic sensor small in size.

The above and other elements, features, steps, characteristics and advantages of the present invention will become

DETAILED DESCRIPTION OF THE PREFERRED EMBODIMENTS

Figure 1:
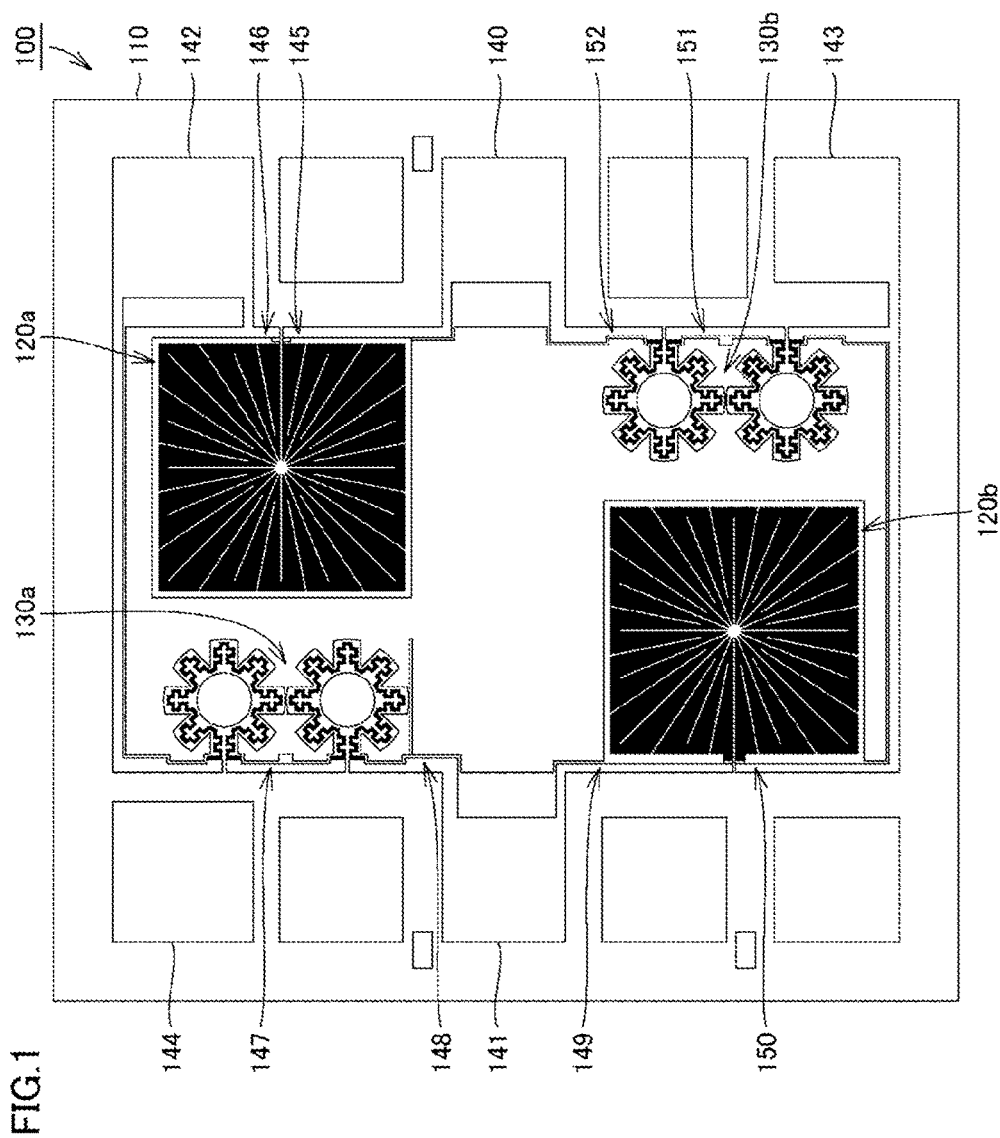
FIG. 1 is a plan view illustrating the patterns of four magnetoresistive elements that define a bridge circuit of a magnetic sensor according to preferred embodiment 1 of the present invention.

Hereafter, magnetic sensors according to preferred embodiments of the present invention will be described while referring to the drawings. In the following description of the preferred embodiments of the present invention, identical or equivalent elements or features in the drawings are denoted by the same symbols and repeated description thereof is omitted.

Preferred Embodiment 1

Figure 2:
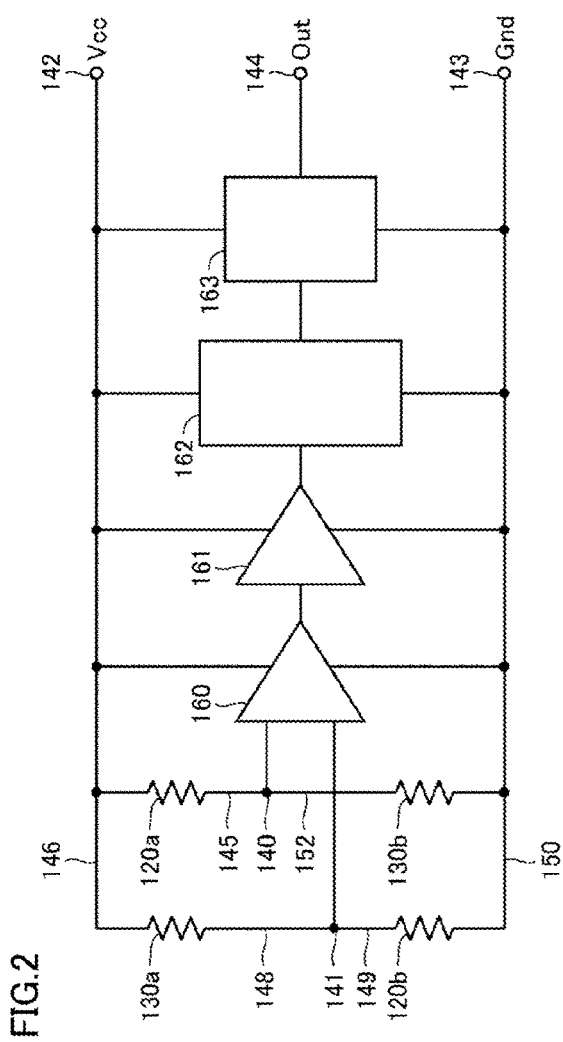
FIG. 2 is an equivalent circuit diagram of the magnetic sensor according to preferred embodiment 1 of the present invention.

FIG. 1 is a plan view illustrating the patterns of four magnetoresistive elements that define a bridge circuit of a magnetic sensor according to preferred embodiment 1 of the present invention. FIG. 2 is an equivalent circuit diagram of the magnetic sensor according to preferred embodiment 1 of the present invention.

As illustrated in FIGS. 1 and 2, a magnetic sensor 100 according to preferred embodiment 1 of the present invention includes a substrate 110 having a rectangular or substantially rectangular shape in plan view and four magnetoresistive elements that are provided on the substrate 110 and are electrically connected to each other to define a Wheatstone-bridge circuit. The four magnetoresistive elements include two first magnetoresistive elements 120a and 120b and two second magnetoresistive elements 130a and 130b.

The rates of change of resistance of the two second magnetoresistive elements 130a and 130b are lower than the rates of change of resistance of the two first magnetoresistive elements 120a and 120b. The two first magnetoresistive elements 120a and 120b are so-called magneto-sensitive resistors having electrical resistance values that change with the application of an external magnetic field. The two second magnetoresistive elements 130a and 130b are fixed resistors having electrical resistance values that substantially do not change even when an external magnetic field is applied.

The four magnetoresistive elements are electrically connected to each other by wiring lines provided on the substrate 110. Specifically, the first magnetoresistive element 120a and the second magnetoresistive element 130a are connected in series with each other by a wiring line 146. The first magnetoresistive element 120b and the second magnetoresistive element 130b are connected in series with each other by a wiring line 150.

The magnetic sensor 100 further includes a center point 140, a center point 141, a power supply terminal (Vcc) 142, a ground terminal (Gnd) 143 and an output terminal (Out) 144 provided on the substrate 110.

The first magnetoresistive element 120a and the second magnetoresistive element 130b are connected to the center point 140. Specifically, the first magnetoresistive element 120a and the center point 140 are connected to each other by a wiring line 145 and the second magnetoresistive element 130b and the center point 140 are connected to each other by a wiring line 152.

The first magnetoresistive element 120b and the second magnetoresistive element 130a are connected to the center point 141. Specifically, the first magnetoresistive element 120b and the center point 141 are connected to each other by a wiring line 149 and the second magnetoresistive element 130a and the center point 141 are connected to each other by a wiring line 148.

The wiring line 146 is connected to the power supply terminal (Vcc) 142 to which a current is input. The wiring line 150 is connected to the ground terminal (Gnd) 143.

As illustrated in FIG. 2, the magnetic sensor 100 further includes a differential amplifier 160, a temperature compensation circuit 161, a latch and switch circuit 162 and a complementary metal oxide semiconductor (CMOS) driver 163.

Input terminals of the differential amplifier 160 are connected to the center point 140 and the center point 141, and an output terminal of the differential amplifier 160 is connected to the temperature compensation circuit 161. In addition, the differential amplifier 160 is connected to the power supply terminal (Vcc) 142 and the ground terminal (Gnd) 143.

An output terminal of the temperature compensation circuit 161 is connected to the latch and switch circuit 162. In addition, the temperature compensation circuit 161 is connected to the power supply terminal (Vcc) 142 and the ground terminal (Gnd) 143.

An output terminal of the latch and switch circuit 162 is connected to the CMOS driver 163. In addition, the latch and switch circuit 162 is connected to the power supply terminal (Vcc) 142 and the ground terminal (Gnd) 143.

An output terminal of the CMOS driver 163 is connected to the output terminal (Out) 144. Furthermore, the CMOS driver 163 is connected to the power supply terminal (Vcc) 142 and the ground terminal (Gnd) 143.

As a result of the magnetic sensor 100 having the above-described circuit configuration, a potential difference, which depends on the strength of an external magnetic field, is generated between the midpoint 140 and the midpoint 141. When this potential difference exceeds a preset detection level, a signal is output from the output terminal (Out) 144.

Figure 3:
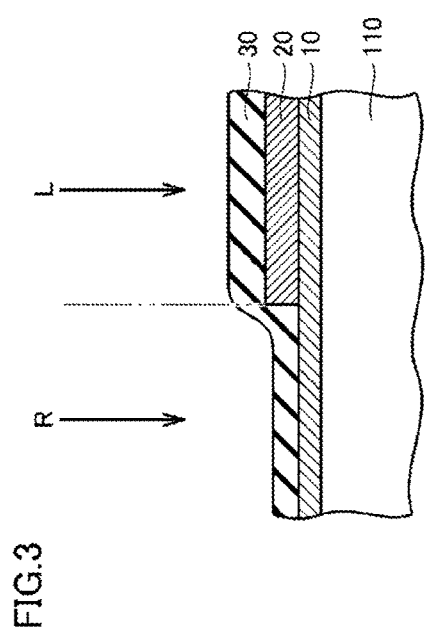
FIG. 3 is a sectional view illustrating the multilayer structure of a connection portion between a magnetoresistive element and a wiring line in the bridge circuit of the magnetic sensor according to preferred embodiment 1 of the present invention.

FIG. 3 is a sectional view illustrating the multilayer structure of a connection portion between a magnetoresistive element and a wiring line in the bridge circuit of the magnetic sensor according to preferred embodiment 1 of the present invention. FIG. 3 illustrates only a connection portion between a region R, which defines and functions as a magnetoresistive element, and a region L, which defines and functions as a wiring line.

As illustrated in FIG. 3, the four magnetoresistive elements are provided on the substrate 110 that includes a $SiO_2$ layer or a $Si_3N_4$ layer provided on a surface thereof and that includes Si or the like. The four magnetoresistive elements are formed preferably by patterning a magnetic layer 10 provided on the substrate 110 and includes an alloy including Ni or Fe by performing milling.

A wiring line is formed preferably by patterning a conductive layer 20, which is provided on the substrate 110 and is composed of Au, Al or the like, preferably by performing wet etching. The conductive layer 20 is located directly above the magnetic layer 10 in the region where the magnetic layer 10 is provided and is located directly above the substrate 110 in the region where the magnetic layer 10 is not provided. Therefore, as illustrated in FIG. 3, the conductive layer 20 is located directly above the magnetic layer 10 in the connection portion between the region R defining and functioning as the magnetoresistive element and the region L defining and functioning as the wiring line.

The center point 140, the center point 141, the power supply terminal (Vcc) 142, the ground terminal (Gnd) 143 and the output terminal (Out) 144 are defined by the conductive layer 20 located directly above the substrate 110.

A Ti layer, which is not illustrated, is provided directly above the conductive layer 20. A protective layer 30, which is composed of $SiO_2$ or the like, covers the magnetoresistive element and the wiring line.

Figure 4:
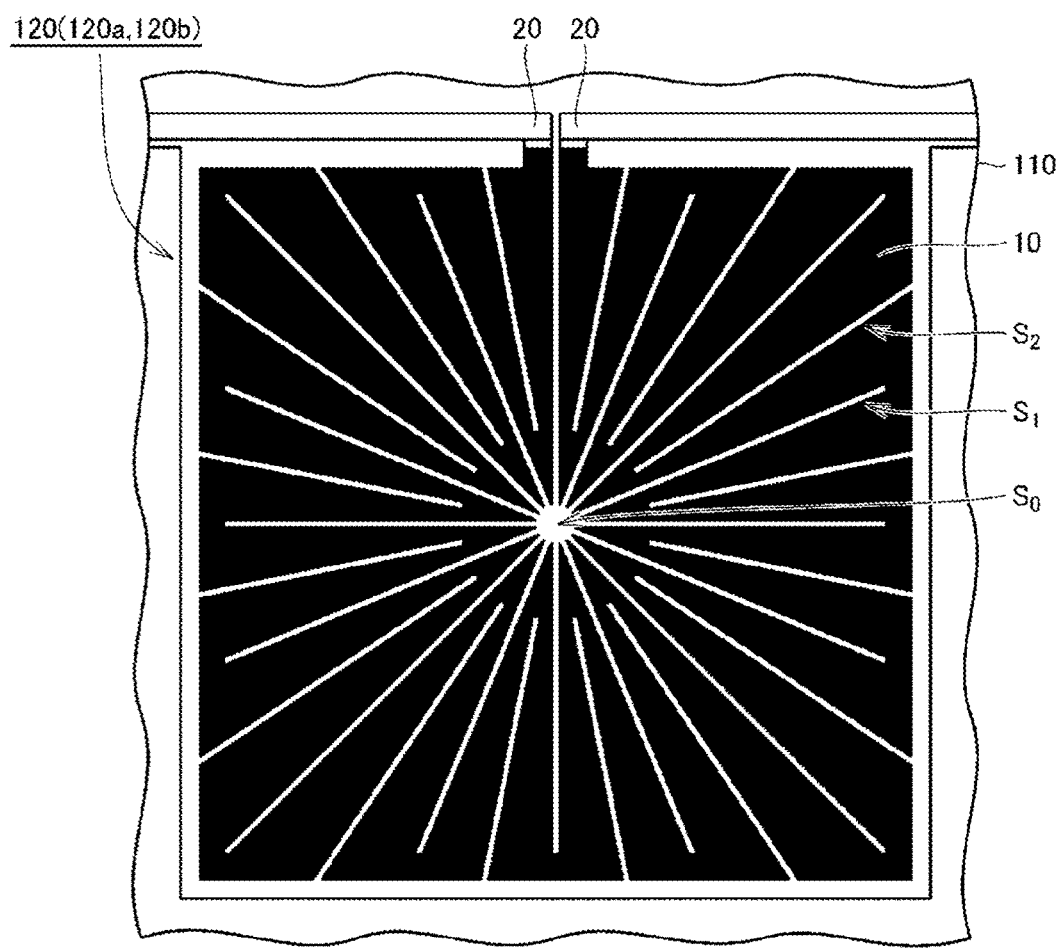
FIG. 4 is a plan view illustrating the pattern of a first magnetoresistive element of the magnetic sensor according to preferred embodiment 1 of the present invention.

FIG. 4 is a plan view illustrating the pattern of a first magnetoresistive element of the magnetic sensor according to an example of preferred embodiment 1 of the present invention. As illustrated in FIGS. 1 and 4, the two first magnetoresistive elements 120a and 120b each include a pattern 120 that has a rectangular or substantially rectangular outer shape in plan view. In plan view, the pattern 120 is provided with a plurality of first slits $S_1$ that extend in a radiating manner from a center $S_0$ of the pattern 120 and approach the outer edge of the pattern 120 and a plurality of second slits $S_2$ that are located between adjacent first slits $S_1$ and extend from the outer edge of the pattern 120 toward the center of the pattern 120, such that the pattern 120 is connected so as to circle around the center of the pattern 120 while alternately changing direction between a first direction toward the outer edge and a second direction toward the center of the pattern 120.

As illustrated in FIG. 4, the pattern 120 is point symmetrical or substantially point symmetrical with respect to a center $S_0$ of the pattern 120. In other words, the pattern 120 has a shape that exhibits 180° or substantially 180° rotational symmetry with respect to the center $S_0$ of the pattern 120.

In an example of the present preferred embodiment, sixteen first slits $S_1$ are preferably provided at intervals of about 22.5° and sixteen second slits $S_2$ are provided at intervals of about 22.5°, for example. The second slits $S_2$ are located between adjacent first slits $S_1$. The widths of the first slits $S_1$ and the second slits $S_2$ preferably are the same as each other or substantially the same as each other.

The distances between the outer shape of the pattern 120 and the leading ends of the sixteen first slits $S_1$ along lines extending from the first slits $S_1$ are the same or substantially the same. The distances between the center $S_0$ of the pattern 120 and the leading ends of the sixteen second slits $S_2$ along lines extending from the second slits $S_2$ are the same or substantially the same.

Here, the numbers, widths, lengths and so forth of the first slits $S_1$ and second slits $S_2$ are not limited to those described above, and for example, a configuration may be adopted in which the widths of the sixteen first slits $S_1$ become larger in a direction from the center of the pattern 120 toward the outside. In the case where such a configuration is adopted, the width of the pattern 120, which is connected into one piece, is made uniform overall and as a result, the isotropy of magnetic field detection is able to be improved.

Figure 5:
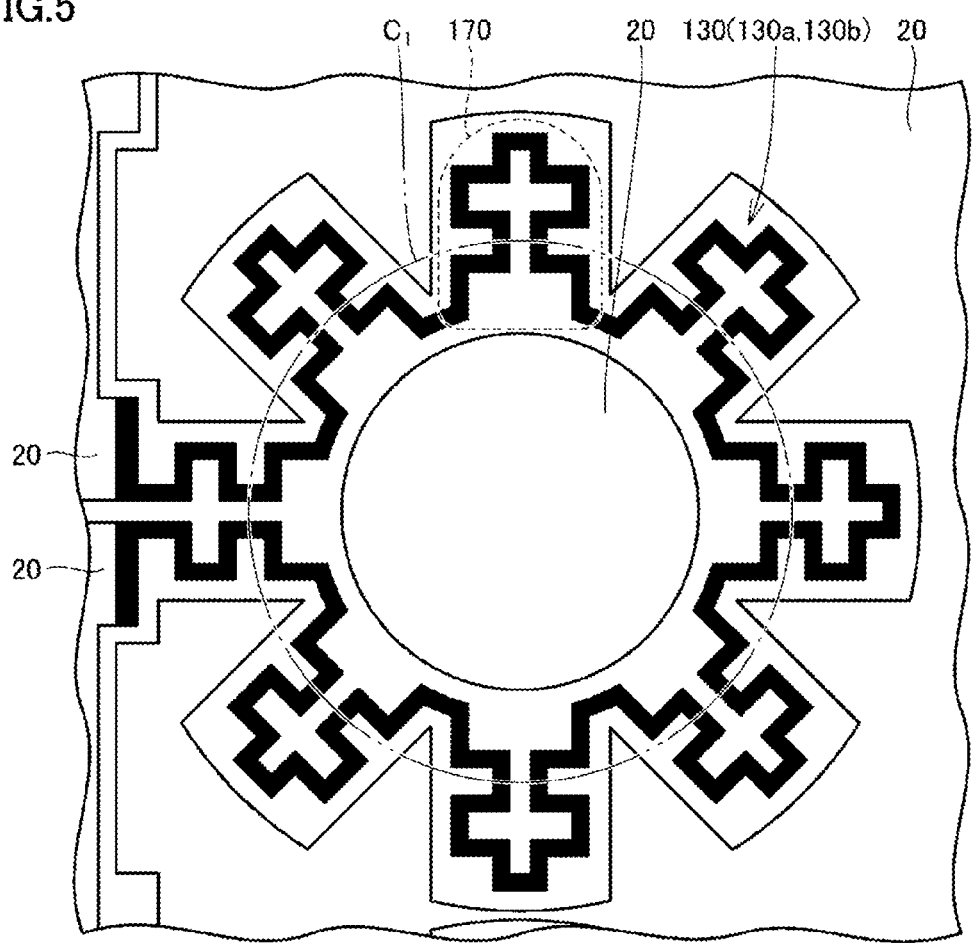
FIG. 5 is a plan view illustrating the pattern of a second magnetoresistive element of the magnetic sensor according to preferred embodiment 1 of the present invention.
Figure 6:
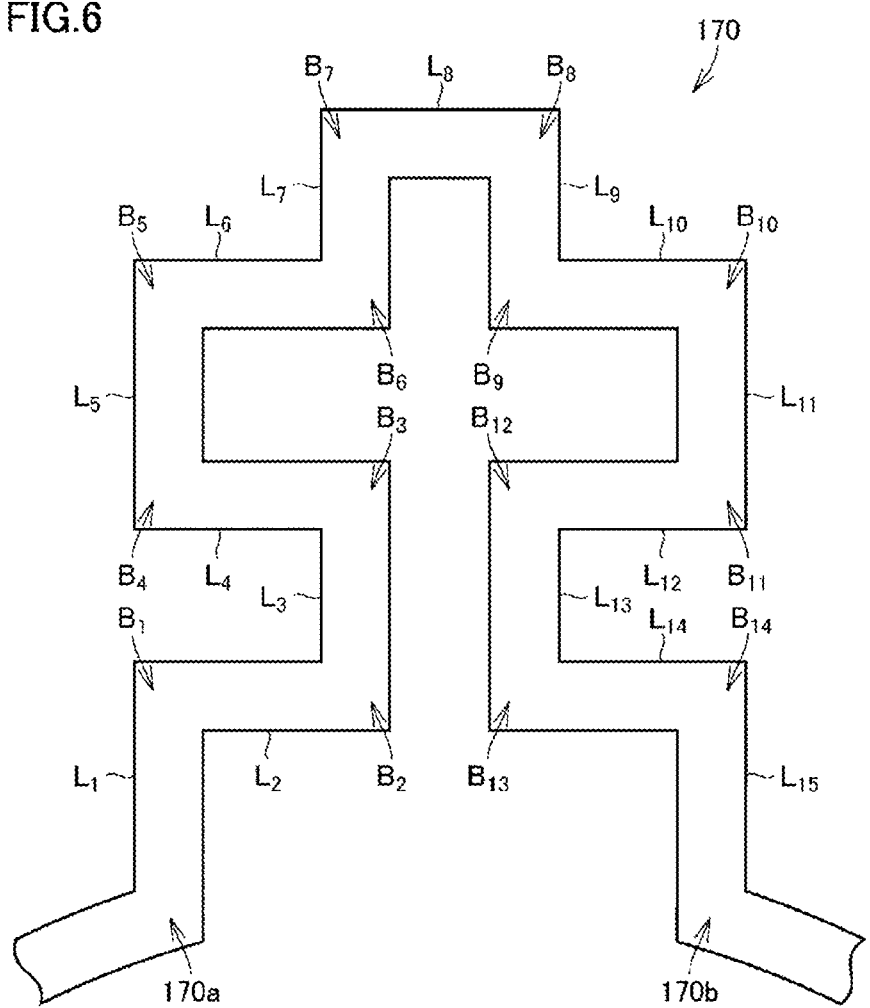
FIG. 6 is a plan view illustrating a unit pattern included in the pattern of the second magnetoresistive element of the magnetic sensor according to preferred embodiment 1 of the present invention.

FIG. 5 is a plan view illustrating the pattern of a second magnetoresistive element of the magnetic sensor according to preferred embodiment 1 of the present invention. FIG. 6 is a plan view illustrating a unit pattern included in the pattern of the second magnetoresistive element of the magnetic sensor according to preferred embodiment 1 of the present invention. In FIG. 5, only one of the two patterns 130, which have identical or substantially identical shapes, of each of the two second magnetoresistive elements 130a and 130b is illustrated.

As illustrated in FIGS. 1 and 5, in each of the two second magnetoresistive elements 130a and 130b, two patterns 130, which have identical or substantially identical shapes and each include eight unit patterns 170 that include a plurality of bent portions and have a folded back shape, are connected in series with each other. The two patterns 130, which have identical or substantially identical shapes, are connected to each other with a wiring line 147 in the second magnetoresistive element 130a. The two patterns 130, which have identical or substantially identical shapes, are connected to each other with a wiring line 151 in the second magnetoresistive element 130b. Thus, the required electrical resistance value is secured in each of the two second magnetoresistive elements 130a and 130b. The higher the electrical resistance values of the two second magnetoresistive elements 130a and 130b are, the more the current consumption of the magnetic sensor 100 is able to be reduced.

As illustrated in FIG. 5, the eight unit patterns 170 are arranged along an imaginary circle $C_1$ and connected to each other. As illustrated in FIG. 6, each unit pattern 170 is folded back on itself in a region between a start end portion 170a and a finish end portion 170b and includes fourteen bent portions $B_1$ to $B_{14}$ and fifteen linear extending portions $L_1$ to $L_{15}$. In other words, the unit pattern 170 preferably has a bag shape with the start end portion 170a and the finish end portion 170b being openings.

In this preferred embodiment, the unit pattern 170 is preferably bent at right angles in each of the fourteen bent portions $B_1$ to $B_{14}$. The unit pattern 170 does not include any linear extending portions having a length of about 10 μm or more, for example. In other words, the lengths of all fifteen linear extending portions $L_1$ to $L_{15}$ are smaller than about 10 μm, for example.

However, the pattern of each of the two second magnetoresistive elements 130a and 130b is not limited to that described above and it is sufficient that the pattern include at least one unit pattern that does not include linear extending portions having a length of about 10 μm or more, that has a plurality of bent portions and that has a folded back shape.

The electrical resistance value of a magnetoresistive element changes due to the magnetoresistive effect when a magnetic field is applied at a specific angle with respect to the direction in which a current flows through the magnetoresistive element. The magnetoresistive effect becomes stronger as the length of the magnetoresistive element in the longitudinal direction thereof increases.

Therefore, as a result of the two second magnetoresistive elements 130a and 130b each having the above-described pattern, the magnetoresistive effects of the two second magnetoresistive elements 130a and 130b are significantly reduced or prevented and the rates of change of resistance of the second magnetoresistive elements 130a and 130b are very low. As a result, the rates of change of resistance of the two second magnetoresistive elements 130a and 130b are lower than the rates of change of resistance of the two first magnetoresistive elements 120a and 120b.

In the magnetic sensor 100 according to this preferred embodiment, the two first magnetoresistive elements 120a and 120b each include the pattern 120. The pattern 120 is connected so as to circle around the center of the pattern 120 while alternately changing direction between a first direction toward the outer edge and a second direction toward the center of the pattern 120, and therefore the direction of the current that flows through the pattern 120 varies across all or substantially all horizontal directions (360°). Therefore, the two first magnetoresistive elements 120a and 120b are each able to detect an external magnetic field across all or substantially all horizontal directions (360°). The horizontal directions are directions that are parallel or substantially parallel to the surface of the substrate 110.

Thus, the anisotropy of the magnetoresistive effects of the two first magnetoresistive elements 120a and 120b are able to be reduced by causing the direction of a current flowing through the pattern 120 to vary across the horizontal directions.

The pattern 120 preferably has a high density per unit area. The pattern 120 is connected into one piece so as to circle around the center of the pattern 120 while alternately changing direction between a first direction toward the outer edge and a second direction toward the center of the pattern 120. Therefore, the pattern 120 is able to be arranged with a high density and is able to have a high resistance by making the length of the pattern 120 long.

Therefore, as a result of the two first magnetoresistive elements 120a and 120b each including the pattern 120, the two first magnetoresistive elements 120a and 120b are able to be made to have high resistances and are able to be small in size. The higher the electrical resistance values of the two first magnetoresistive elements 120a and 120b are, the more the current consumption of the magnetic sensor 100 is reduced.

Furthermore, since the pattern 120 preferably has a rectangular or substantially rectangular outer shape in plan view, the pattern 120 is able to be efficiently arranged on the substrate 110, which has a rectangular or substantially rectangular shape in plan view. That is, by providing the pattern 120 so as to conform to the outer shape of the substrate 110, the occurrence of excess space around the pattern 120 is able to be significantly reduced or prevented.

Therefore, the magnetic sensor 100 is able to be made small in size by efficiently arranging the two first magnetoresistive elements 120a and 120b on the substrate 110 while making the first magnetoresistive elements 120a and 120b small in size.

In the magnetic sensor 100 according to this preferred embodiment, the two second magnetoresistive elements 130a and 130b each include unit patterns 170 that each preferably have a bag shape that does not include any linear extending portions having a length of about 10 μm or more, that is bent at right angles in fourteen bent portions $B_1$ to $B_{14}$ and in which the start end portion 170a and the finish end portion 170b are openings, for example.

Thus, the anisotropy of the magnetoresistive effects of the two second magnetoresistive elements 130a and 130b are able to be reduced by causing the direction of a current flowing through the unit patterns 170 to vary across the horizontal directions. In addition, variations in the output of the magnetic sensor 100 that occur when the external magnetic field is zero are able to be significantly reduced or prevented, the variations being caused by the effect of residual magnetization.

In addition, the anisotropy of the magnetoresistive effect of the two second magnetoresistive elements 130a and 130b is able to be reduced by causing the direction of the current that flows through the pattern 130 to vary across the horizontal directions by arranging the plurality of unit patterns 170 along the circumference of the imaginary circle $C_1$.

Figure 7:
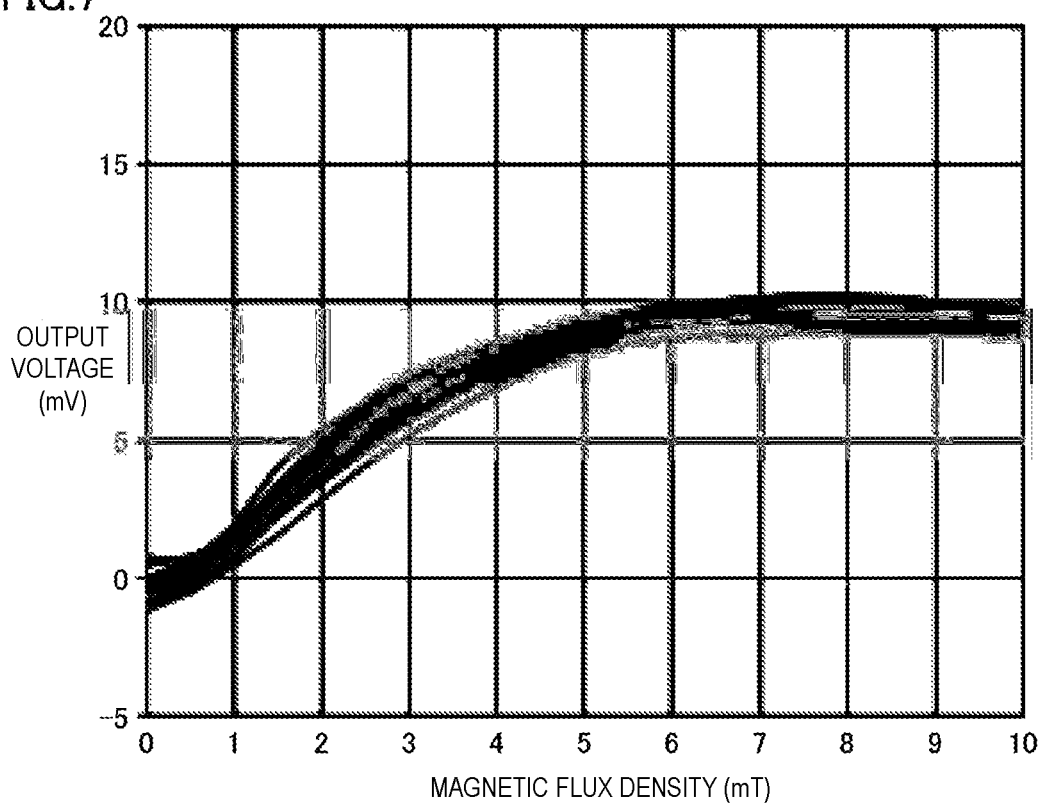
FIG. 7 is a graph illustrating the results of an experiment in which the direction in which an external magnetic field was applied to a magnetic sensor 100 according to preferred embodiment 1 of the present invention among horizontal directions was changed from 0° to about 337.5° at intervals of about 22.5° and the relationship between the strength of the external magnetic field and the output of the magnetic sensor 100 was obtained.

FIG. 7 is a graph illustrating the results of an experiment in which the direction in which an external magnetic field was applied to the magnetic sensor 100 according to preferred embodiment 1 of the present invention among the horizontal directions was changed from 0° to about 337.5° at intervals of about 22.5° and the relationship between the strength of the external magnetic field and the output of the magnetic sensor 100 was obtained. In FIG. 7, the output voltage (mV) of the magnetic sensor 100 is illustrated along the vertical axis and the magnetic flux density (mT) is illustrated along the horizontal axis.

As illustrated in FIG. 7, in the magnetic sensor 100 according to this preferred embodiment, a large change in the relationship between the strength of the external magnetic field and the output of the magnetic sensor 100 could not be recognized even when the direction in which the external magnetic field was applied among the horizontal directions was changed from 0° to about 337.5° at intervals of about 22.5°, for example. In other words, it could be confirmed that the magnetic sensor 100 according to this preferred embodiment has improved isotropy in magnetic field detection. In addition, it could also be confirmed that variations in the output of the magnetic sensor 100 that occur when the external magnetic field is zero are significantly reduced or prevented.

Although the magnetic sensor 100 preferably includes two first magnetoresistive elements 120a and 120b and two second magnetoresistive elements 130a and 130b in this preferred embodiment, the magnetic sensor 100 is not limited to this configuration and it is sufficient that the magnetic sensor 100 include at least one first magnetoresistive element. Thus, the isotropy of magnetic field detection is able to be improved while making the magnetic sensor 100 small in size. In addition, in the case where the magnetic sensor 100 includes a second magnetoresistive element, it is sufficient that the magnetic sensor 100 include at least one second magnetoresistive element.

Hereafter, a magnetic sensor according to preferred embodiment 2 of the present invention will be described while referring to the drawings. The magnetic sensor according to this preferred embodiment differs from the magnetic sensor 100 according to preferred embodiment 1 only in terms of the pattern of the second magnetoresistive elements and therefore repeated description of the rest of the configuration will be omitted.

Preferred Embodiment 2

Figure 8:
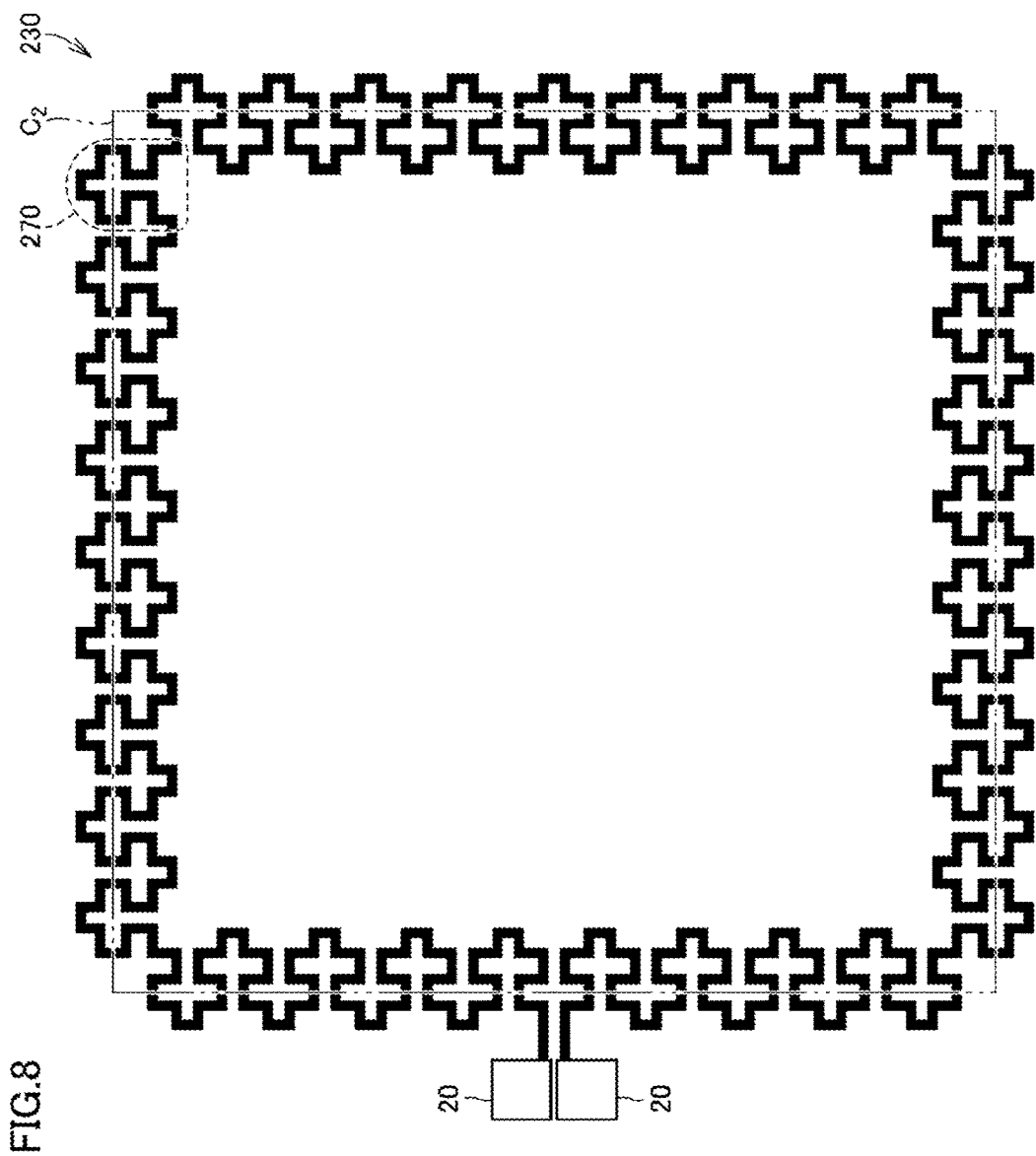
FIG. 8 is a plan view illustrating the pattern of a second magnetoresistive element of a magnetic sensor according to preferred embodiment 2 of the present invention.
Figure 9:
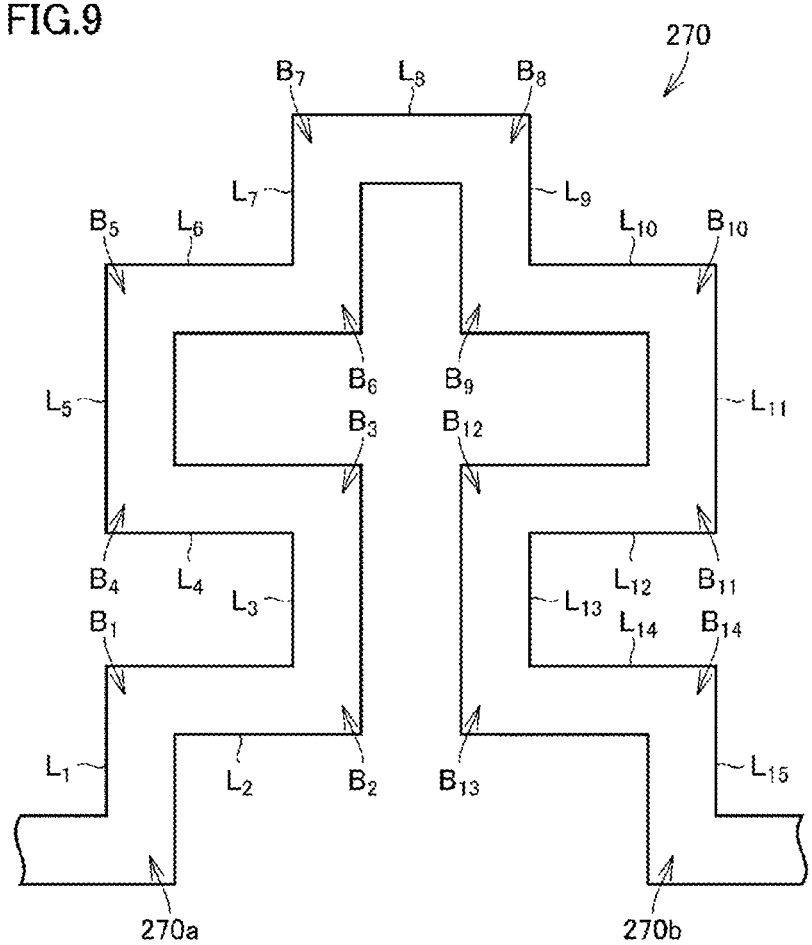
FIG. 9 is a plan view illustrating a unit pattern included in the pattern of the second magnetoresistive element of the magnetic sensor according to preferred embodiment 2 of the present invention.

FIG. 8 is a plan view illustrating the pattern of a second magnetoresistive element of the magnetic sensor according to preferred embodiment 2 of the present invention. FIG. 9 is a plan view illustrating a unit pattern included in the pattern of the second magnetoresistive element of the magnetic sensor according to preferred embodiment 2 of the present invention.

As illustrated in FIG. 8, the two second magnetoresistive elements of the magnetic sensor according to preferred embodiment 2 of the present invention each preferably include a pattern 230 that includes thirty-two unit patterns 270 that each include a plurality of bent portions and have a folded back shape.

As illustrated in FIG. 8, the thirty-two unit patterns 270 are arranged along an imaginary rectangle $C_2$ and connected to each other. The plurality of unit patterns 270 may instead be arranged along an imaginary polygonal shape other than an imaginary rectangle.

As illustrated in FIG. 9, each unit pattern 270 is folded back on itself in a region between a start end portion 270a and a finish end portion 270b and includes fourteen bent portions $B_1$ to $B_{14}$ and fifteen linear extending portions $L_1$ to $L_{15}$. In other words, the unit pattern 270 preferably has a bag shape with the start end portion 270a and the finish end portion 270b being defined by openings.

In this preferred embodiment, the unit pattern 270 is bent at right angles in each of the fourteen bent portions $B_1$ to $B_{14}$. The unit pattern 270 does not include any linear extending portions having a length of about 10 µm or more, for example. In other words, the lengths of all fifteen linear extending portions $L_1$ to $L_{15}$ are smaller than about 10 µm, for example.

The plurality of unit patterns 270 of the two second magnetoresistive elements of the magnetic sensor according to preferred embodiment 2 of the present invention are arranged along the imaginary rectangle $C_2$, and therefore the anisotropy of the magnetoresistive effect of the two second magnetoresistive elements is able to be reduced by causing the direction in which a current flows through the pattern 230 to vary across the horizontal directions.

Furthermore, since the pattern 230 has a rectangular or substantially rectangular outer shape in plan view, the pattern 230 is able to be efficiently arranged on the substrate 110, which has a rectangular or substantially rectangular shape in plan view. That is, by providing the pattern 230 so as to conform to the outer shape of the substrate 110, the occurrence of excess space around the pattern 230 is able to be significantly reduced or prevented.

Therefore, the magnetic sensor 100 is able to be made small in size by efficiently arranging the two second magnetoresistive elements on the substrate 110.

The presently disclosed preferred embodiments are illustrative in all points and should be not be considered as limiting. The scope of the present invention is not defined by the above description but rather by the scope of the claims and it is intended that equivalents to the scope of the claims and all modifications within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
    a substrate that has a rectangular or substantially rectangular shape in plan view; and
    at least one first magnetoresistive element that is provided on the substrate; wherein
    the at least one first magnetoresistive element includes a pattern having a rectangular or substantially rectangular outer shape in plan view; and
    in plan view, the pattern is provided with a plurality of first slits that extend in a radiating manner from a center of the pattern and approach an outer edge of the pattern and a plurality of second slits that are located between adjacent first slits and extend from the outer edge of the pattern toward the center of the pattern, and the pattern is connected so as to circle around the center of the pattern while alternately changing direction between a first direction toward the outer edge of the pattern and a second direction toward the center of the pattern.

2. The magnetic sensor according to claim 1, wherein
    a plurality of the first magnetoresistive elements are provided; and
    the plurality of first magnetoresistive elements are electrically connected to each other and define a bridge circuit.

3. The magnetic sensor according to claim 1, further comprising:
    at least one second magnetoresistive element having a lower rate of change of resistance than the first magnetoresistive element; wherein the first magnetoresistive element and the second magnetoresistive element are electrically connected to each other and define a bridge circuit.

4. The magnetic sensor according to claim 3, wherein the second magnetoresistive element includes at least one unit pattern that includes a plurality of bent portions and has a folded back shape;
    the at least one unit pattern does not include any linear extending portions having a length of 10 µm or more.

5. The magnetic sensor according to claim 4, wherein the second magnetoresistive element includes a plurality of the unit patterns arranged along an imaginary circle and connected to each other.

6. The magnetic sensor according to claim 4, wherein the second magnetoresistive element includes a plurality of the unit patterns arranged along an imaginary polygon and connected to each other.

7. The magnetic sensor according to claim 1, wherein two of the at least one first magnetoresistive element is provided and two second magnetoresistive elements are provided.

8. The magnetic sensor according to claim 2, wherein the bridge circuit is a Wheatstone bridge circuit.

9. The magnetic sensor according to claim 7, wherein the two first magnetoresistive elements are magneto-sensitive resistors having variable resistance values and the two second magnetoresistive elements are fixed resistors.

10. The magnetic sensor according to claim 9, wherein a first of the two first magnetoresistive elements is connected in series to a first of the two second magnetoresistive elements and a second of the two first magnetoresistive elements is connected in series to a second of the two second magnetoresistive elements.

11. The magnetic sensor according to claim 10, wherein a first wiring line connects the first of the two first magnetoresistive elements in series to the first of the two second magnetoresistive elements and a second wiring line connects the second of the two first magnetoresistive elements in series to the second of the two second magnetoresistive elements.

12. The magnetic sensor according to claim 1, further comprising:
a first center point;
a second center point;
a power supply terminal;
a ground terminal; and
an output terminal; wherein
each of the first center point, the second center point, the ground terminal and the output terminal are provided on the substrate.

13. The magnetic sensor according to claim 1, further comprising:
a differential amplifier;
a temperature compensation circuit;
a latch and switch circuit; and
a complementary metal oxide semiconductor driver.

14. The magnetic sensor according to claim 1, wherein the substrate includes a $SiO_2$ layer or a $Si_3N_4$ layer thereon.

15. The magnetic sensor according to claim 1, wherein a protective layer is provided on the substrate to cover the at least one first magnetoresistive element.

16. The magnetic sensor according to claim 1, wherein the pattern is point symmetrical or substantially point symmetrical with respect to a center of the pattern.

17. The magnetic sensor according to claim 1, wherein the plurality of first slits are arranged at intervals of about 22.5° from each other and the plurality of second slits are arranged at intervals of about 22.5° from each other.

18. The magnetic sensor according to claim 1, wherein widths of the plurality of firsts slits are equal or substantially equal to widths of the plurality of second slits.

19. The magnetic sensor according to claim 1, wherein distances between the outer shape of the pattern and leading ends of the plurality of first slits along lines extending from the plurality of first slits are equal or substantially equal.

20. The magnetic sensor according to claim 1, wherein distances between the outer shape of the pattern and leading ends of the plurality of second slits along lines extending from the plurality of second slits are equal or substantially equal.

* * * * *